United States Patent [19]

Okamoto

[11] Patent Number: 5,063,329

[45] Date of Patent: Nov. 5, 1991

[54] MICROWAVE PLASMA SOURCE APPARATUS

[75] Inventor: Yukio Okamoto, Sagamihara, Japan

[73] Assignee: Hitachi, Ltd., Tokyo, Japan

[21] Appl. No.: 577,767

[22] Filed: Sep. 5, 1990

[30] Foreign Application Priority Data

Sep. 8, 1989 [JP] Japan ................... 1-231741

[51] Int. Cl.$^5$ ............................................. H05H 1/46
[52] U.S. Cl. ........................ 315/111.21; 315/39;
313/231.31; 333/99 PL
[58] Field of Search ............... 315/111.21, 111.41,
315/111.81, 39; 313/231.31; 333/99 PL

[56] References Cited

U.S. PATENT DOCUMENTS

| | | | |
|---|---|---|---|
| Re. 33,386 | 10/1990 | Douglas | 315/111.81 X |
| 4,176,295 | 11/1979 | Driver et al. | 315/39 |
| 4,207,452 | 6/1980 | Arai | 315/39 X |
| 4,551,609 | 11/1985 | Falk | 313/231.31 X |
| 4,609,808 | 9/1986 | Bloyet et al. | 315/111.21 X |
| 4,886,966 | 12/1989 | Matsunaga et al. | 315/111.81 X |
| 4,902,099 | 2/1990 | Okamoto et al. | 315/111.21 X |
| 4,908,492 | 3/1990 | Okamoto et al. | 315/111.21 X |
| 4,933,650 | 6/1990 | Okamoto | 315/111.41 X |

Primary Examiner—Eugene R. LaRoche
Assistant Examiner—Do Hyun Yoo
Attorney, Agent, or Firm—Fay, Sharpe, Beall, Fagan, Minnich & McKee

[57] ABSTRACT

A microwave plasma source apparatus having a combination of a plane waveguide with a cylindrical coaxial waveguide. Microwave power is efficiently supplied to a body of discharge plasma produced inside a discharge tube located along the central axis of an inner conductor of the cylindrical coaxial waveguide. The plane waveguide has an open end through which to introduce microwave power and an end plate installed opposite to the open end. The cylindrical coaxial waveguide has its central axis located one quarter of the wavelength of the microwave power in use away from the end plate of the plane waveguide toward its open end. The inner and outer conductors of the cylindrical coaxial waveguide are coupled respectively with the bottom and upper walls of the plane waveguide. This arrangement allows the cylindrical coaxial waveguide to function as an efficient mode transformer addressing the microwave electromagnetic field formed in the plane waveguide. This in turn makes it possible to produce microwave plasma of large power at high degrees of efficiency.

48 Claims, 4 Drawing Sheets

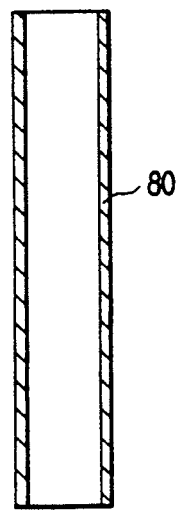
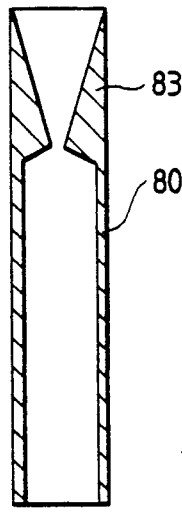
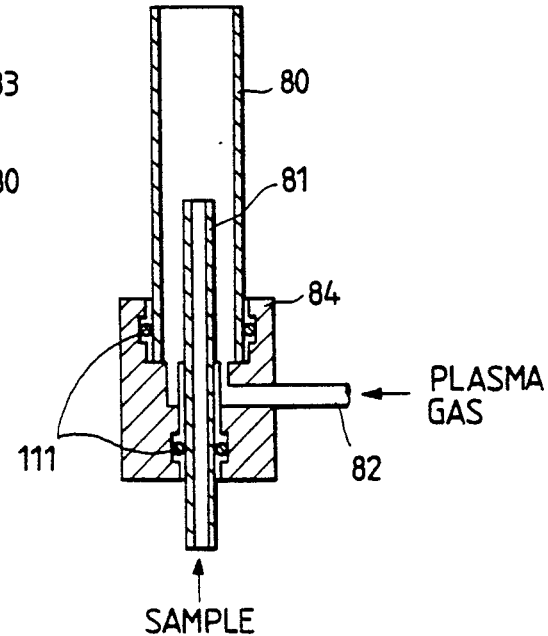
FIG. 4A  FIG. 4B  FIG. 4C
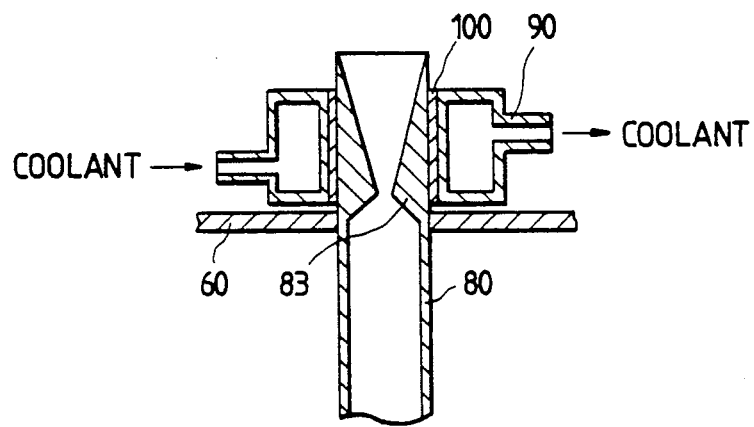
FIG. 5

MICROWAVE PLASMA SOURCE APPARATUS

BACKGROUND OF THE INVENTION

The present invention relates to a plasma source apparatus utilizing microwave power and, more particularly, to a microwave plasma source apparatus capable of producing a high-temperature, high-density plasma with high efficiency and stability for use in trace element spectrometry with plasma source, plasma jet and plasma processing.

Prior art plasma source apparatus that utilize microwave power are illustratively discussed in such publications as "Spectrochimica Acta (Vol. 37B, No. 7, pp. 583–592, 1982)."

FIGS. 6A and 6B outline the microwave plasma source apparatus called SURFATRON which is described in the above-mentioned publication. This apparatus has its microwave power supplied through a coaxial connector 1 which is connected to a coaxial cable. The supplied microwave power passes through a coaxial line before being introduced into a cavity 6 via a microwave coupler 2. The cavity 6 is penetrated by a quartz discharge tube 7. At one axial end of the cavity 6 is a metal plate 4. The axial length of the cavity 6 is adjusted by a cavity length adjusting system 5. A gap length "g" is adjusted by a gap adjusting system 3. Cooling air is introduced into the cavity 6 through an air introduction port 9.

In this apparatus, a sample is mixed with a carrier gas for use as a gas sample. The gas sample is mixed with a plasma gas for introduction into the discharge tube 7 through a gas introduction port 8. The plasma gas thus introduced is excited by the microwave power led into the cavity 6, thereby producing a plasma inside the discharge tube 7. In this plasma, the sample is excited and then ionized.

One disadvantage of this prior art apparatus is that it has no consideration for analysis of aqueous samples. The fact that the apparatus accepts only gas samples for analysis limits the types of samples to be analyzed. Another disadvantage of the prior art apparatus is its low levels of sample introduction efficiency and ionization efficiency. A further disadvantage is that the apparatus does not provide an adequate safeguard against leaks of microwave power. Another disadvantage is that the stability of plasma production with this apparatus is not sufficiently high.

As shown in FIG. 6A, the prior art apparatus supplies the cavity 6 with microwave power for plasma production through the coaxial cable and coupler 2. This arrangement limits the level of the plasma power that may be supplied to a maximum of about 0.5 kW. Thus the apparatus is incapable of producing a hot and high density plasma directly excite and ionize aqueous samples. This means that direct analysis of aqueous samples is impossible with the prior art apparatus. Other impediments include an appreciable loss of power over the coaxial cable, complicated structures of such components as coupler 2, and cumbersome adjustments required of these parts. Because the plasma source apparatus of the prior art construction has low levels of efficiency in utilizing microwave power, the apparatus when used as an ionizer for analytical samples fails to provide sufficiently high levels of sensitivity due to its low levels of ionization efficiency.

Furthermore, the leaking microwave power from openings such as a window of the metal plate 4 at one end of the cavity 6 tends to worsen the S/N ratio of signals detected for sample analysis. The leaks can also cause jamming of radio waves. The air introduced to cool the discharge tube 7 and other related parts flows from the window of the metal plate 4 toward the tip of the discharge tube 7. The air flow destabilizes the state of the plasma released from the tip of the discharge tube 7. This makes it impossible to ensure high sensitivity and stability in carrying out emission analyses using the emission of samples or in conducting mass analyses using sample ionization.

SUMMARY OF THE INVENTION

It is therefore an object of the present invention to provide a microwave plasma source apparatus which efficiently supplies microwaves of large power into a plasma-producing space so as to produce a plasma at sufficiently high levels of temperature and density.

It is another object of the present invention to provide a microwave plasma source apparatus which directly introduces an aqueous sample into the produced plasma in order to excite and ionize the sample for direct analysis.

It is a further object of the present invention to provide a microwave plasma source apparatus which has safety measures for preventing microwaves from leaking out of the apparatus.

It is an even further object of the present invention to provide a microwave plasma source apparatus which comprises a cooling system capable of efficiently cooling a plasma-producing discharge tube, inner walls of the apparatus and other parts inside.

It is another object of the present invention to provide a microwave plasma source apparatus which prevents the flow of a coolant gas for cooling the discharge tube and other related parts from disturbing the stability of the produced plasma, thereby ensuring the stable production and maintenance of plasma.

In achieving the foregoing and other objects of the invention and according to a first aspect thereof, there is provided a microwave plasma source apparatus comprising the combination of a plane waveguide with a cylindrical coaxial waveguide as a means for supplying microwave power to the plasma-producing space. That is, the entire route of microwave power supply is constituted by a waveguide arrangement. The plane waveguide has an open end through which to introduce microwave power from outside the apparatus. Axially opposite to the open end is an end plate of the plane waveguide. The two waveguides are coupled with each other so that where the central axis of the cylindrical coaxial waveguide is positioned one quarter of the wavelength of the microwave power in use away from the end plate of the plane waveguide, the cylindrical coaxial waveguide is directed to the microwave electric field formed within the plane waveguide. Specifically, the lower end of an inner conductor of the cylindrical coaxial waveguide is coupled with the circumference edge of a circular hole provided on a bottom wall of the plane waveguide, the upper end of the inner conductor being left open. The lower end of an outer conductor of the cylindrical coaxial waveguide is coupled with the circumference edge of a circular hole provided on an upper wall of the plane waveguide, the upper end of the outer conductor being short-circuited by a conductive end plate. A discharge tube made of insulating material is provided along the central axis of the inner conductor of the cylindrical coaxial waveguide. The upper end of the discharge tube protrudes up from a through hole at the center of the conductive end plate, the tip of the tube upper end being left open. The lower end of the discharge tube is connected to a plasma gas introduction system and to a sample introduction system.

The cylindrical coaxial waveguide of the above-described construction acts as an efficient mode transformer. Because the entire route for microwave power introduction into the discharge tube is constituted by the waveguide arrangement, microwaves of large power may be supplied efficiently into a body of plasma. This makes it possible to produce a plasma at levels of temperature and density high enough to carry out direct analyses of aqueous samples.

According to a second aspect of the invention, there is provided a microwave plasma source apparatus comprising a coolant gas introduction system that introduces a coolant gas into the lower end of the discharge tube. The coolant gas flows upward along the outer surface of the discharge tube for cooling thereof. Because this arrangement efficiently cools the discharge tube, the plasma inside the tube remains stable while the heat resistant life of the apparatus is prolonged. The coolant gas after going through the cooling process is released to the outside through a plurality of discharge ports provided on a peripheral wall of the outer conductor of the cylindrical coaxial waveguide. In this setup, the discharged coolant gas flows perpendicular to the axis of the cylindrical coaxial waveguide and does not directly hit the tip of the discharge tube. Thus the stability of the plasma released from the discharge tube is not disturbed.

According to a third aspect of the invention, there is provided a microwave plasma source apparatus comprising a microwave leakage adjusting system under the bottom surface of the inner conductor of the cylindrical coaxial waveguide. This system is used to make sure that the distance between the open end of the inner conductor and the bottom edge of a conductor surrounding the lower end of the discharge tube is at least one quarter of the wavelength of the microwave power in use. That is, the system ensures that the bottom edge of the conductor coincides with a joint of the standing wave of the microwave being used. This arrangement prevents microwave leakage via the inner space of the conductor surrounding the lower end of the discharge tube. That in turn makes it possible to provide a plasma source apparatus which is safe and highly efficient with a minimum of power loss and no jamming hazards.

The above and other related objects and features of the invention, as well as the novelty thereof, will clearly appear from the following description and from the accompanying drawings.

BRIEF DESCRIPTION OF THE DRAWINGS

FIGS. 4A, 4B and 4C are cross-sectional views of representative discharge tubes used in the embodiments;

FIG. 5 is a cross-sectional view of a typical tip portion of a discharge tube used in the embodiments.

DESCRIPTION OF PREFERRED EMBODIMENTS

Figure 1A:
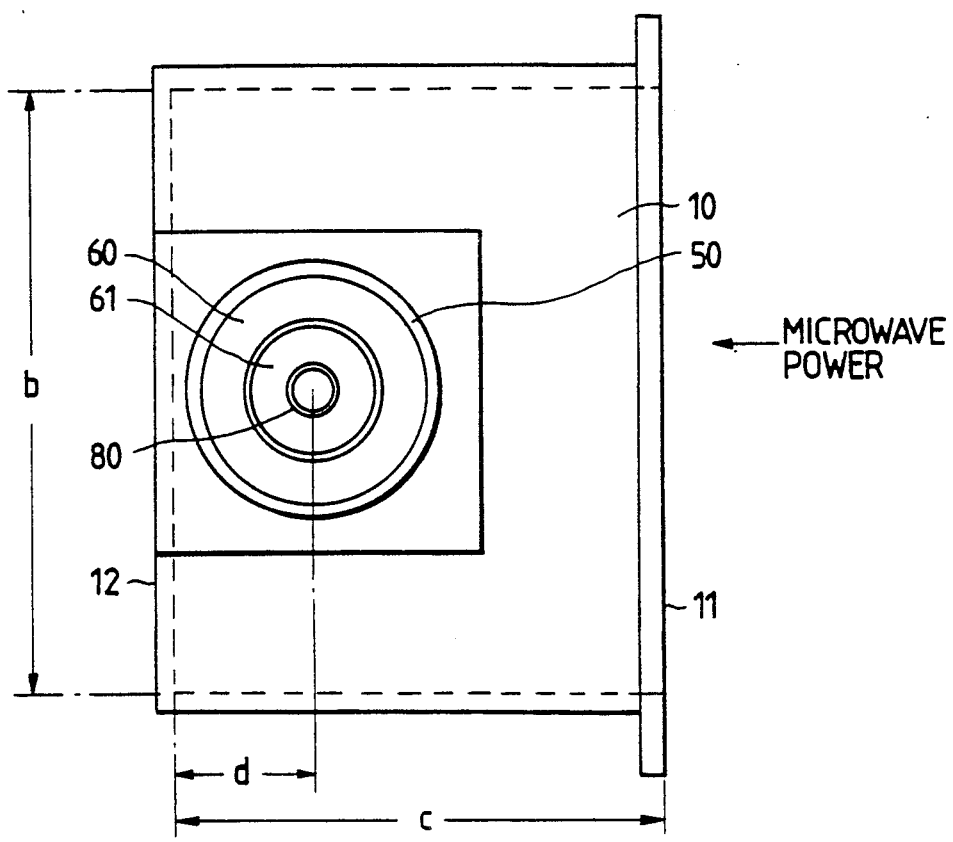
FIGS. 1A and 1B are a plan view and a cross-sectional view, respectively, of a microwave plasma source apparatus as one embodiment of the present invention.
Figure 1B:
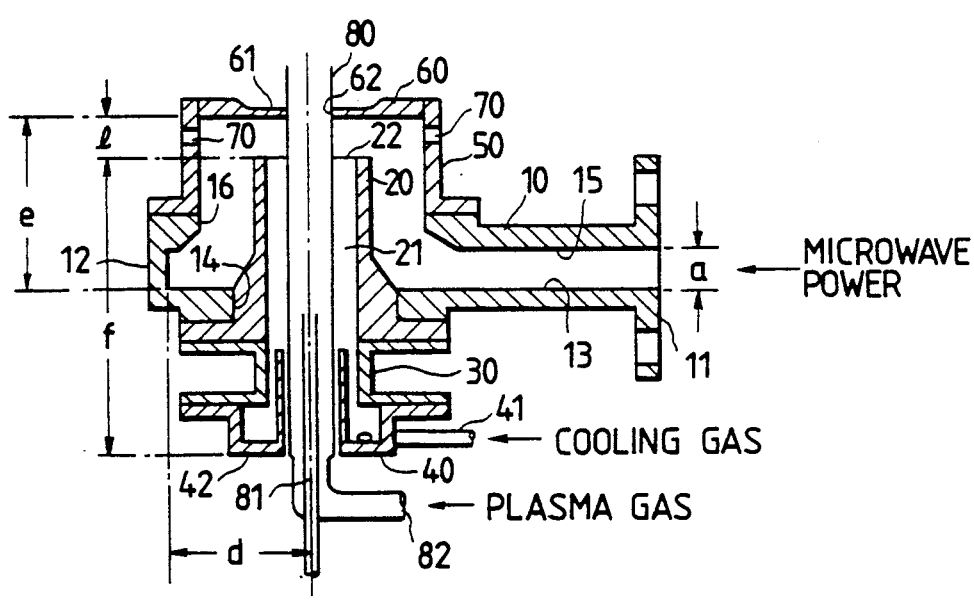

Preferred embodiments of the invention will now be described in detail with reference to the accompanying drawings. FIGS. 1A and 1B are respectively a plan view and a cross-sectional view of a microwave plasma source apparatus as one embodiment of the invention. This embodiment suitably functions as a plasma source apparatus for element analysis.

In FIGS. 1A and 1B, a plane waveguide 10 is made up of conductive material such as copper. Where the frequency of the microwave power in use is 2.45 GHz, the interior of the waveguide illustratively measures 8.4 mm (dimension "a") by 109.2 mm (dimension "b") by 87 mm (dimension "c"). Microwave power is introduced through an open end 11 of the plane waveguide 10. Opposite to the open end 11 is an end plate 12. At a distance "d" equivalent to one quarter of the wavelength of the microwave power in use away from the end plate 12 is the central axis of a cylindrical coaxial waveguide constituted by a cylindrical inner conductor 20 and a cylindrical outer conductor 50. The cylindrical coaxial waveguide is coupled with the plane waveguide in a way that the central axis of the cylindrical coaxial waveguide is in the direction of the microwave electric field.

More specifically, the cylindrical inner conductor 20 constituting part of the cylindrical coaxial waveguide is illustratively made up of conductive material such as copper and has a cross section shown in FIG. 1B. Inside the inner conductor 20 is a cylindrical cavity 21. The lower end of the inner conductor 20 passes through a circular hole 14 on a bottom wall 13 of the plane waveguide and is coupled with the wall 13. The upper end of the inner conductor 14 is left open. The cylindrical outer conductor 50 is likewise made up of conductive material such as copper. The lower end of the outer conductor 50 is coupled with an upper wall 15 at the outer periphery of a circular hole 16 of the plane waveguide 10. The upper end of the outer conductor 50 is short-circuited by an end plate 60 a distance (typically 1–20 mm) above the open end of the inner conductor 20, the end plate being made up of conductive material such as copper.

Where the inner conductor 20 and the outer conductor 50 are coupled with the plane waveguide 10 as described above, the cylindrical coaxial waveguide constituted by the two conductors acts as a mode transformer that addresses the microwave power introduced into the plane waveguide 10. A discharge tube 80 made up of electrical insulating material such as quartz or ceramics concentrically penetrates the inner conductor 20 of the cylindrical coaxial waveguide. The lower end of the discharge tube 80 protrudes downward from the lower end of the inner conductor 20. The upper end of the discharge tube 80 passes through the open end 22 of the inner conductor 20 and protrudes upward from a through hole 62 on the end plate 60 of the outer conductor 50. The end plate 60 has, at a periphery 61 of the through hole 62, a thickness concentric with the hole 62 and less than the thickness of the outer portion thereof.

Under the inner conductor 20 is a microwave leakage adjusting system 30 for preventing microwave leakage. The system 30 principally comprises a cylinder made up of conductive material such as copper. Inside the cylinder is a cylindrical space that surrounds the lower end of the discharge tube 80.

Under the microwave leakage adjusting system 30 is a coolant gas introduction system 40 for cooling the discharge tube 80, inner conductor 20 and other parts. The system principally comprises a cap-like member made up of conductive material such as copper. A coolant gas (e.g., air) is introduced via an introduction pipe 41 into the coolant gas introduction system 40 in the tangential direction thereof. The coolant gas thus introduced flows spirally over the surface of the discharge tube 80. The coolant gas passes through an internal space 21 of the inner conductor 20 and goes into the cylindrical space within the outer conductor 50 through its open end 22. Eventually the coolant gas is released to the outside through a plurality of discharge ports 70 on the peripheral wall of the outer conductor 50 (illustratively 16 ports equally dividing the circumference into 16 parts).

This embodiment is shown as one that suitably acts as a plasma source apparatus for element analysis. For this reason, the lower end of the discharge tube 80 is of a two concentric tube structure. In this setup, the sample to be analyzed is introduced from the lower end of an inner tube 81, while the plasma gas (comprising He, $N_2$, Ar, air, etc.) is separately introduced from a gas introduction port 82 at the lower end of an outer tube.

With this embodiment, the microwave leakage adjusting system 30 and the coolant gas introduction system 40 are separately provided. It will be appreciated that the two systems may alternatively be integrated into one system.

In the construction described above, as shown in FIG. 1B, the axial length "e" of the outer conductor 50 (distance between bottom surface of end plate 60 and top surface of bottom wall 13) is set for at least one quarter of the wavelength of the microwave power in use. The gap length between the open end 22 of the inner conductor 20 and the end plate 60 is set to fall within a range of 1 to 20 mm. The dimension "f" between the open end 22 of the inner conductor 20 and a lower edge 42 of the coolant gas introduction system 40 is set for at least one quarter of the wavelength of the microwave power being used. This arrangement causes the bottom surface of the end plate 60 and the lower edge of the cooling gas introduction system 40 to coincide respectively with a belly and a joint of the standing wave of the microwave power. That in turn allows the microwave power introduced through the open end 11 of the plane waveguide 10 to be efficiently absorbed into the plasma produced inside the discharge tube 80. With the reflection of microwaves eliminated and with significant savings gained in leak power, a body of plasma may be produced and maintained at high levels of temperature and concentration.

In the above embodiment, one waveguide construction (plane waveguide) is used to introduce microwave power and another waveguide construction (cylindrical coaxial waveguide) is used for mode transformation of the microwave power introduced. This setup permits the use of large microwave power at 0.5 kW or higher for plasma production. That in turn allows a high-temperature, high-density plasma to be stably produced and maintained. Aqueous samples may be sufficiently excited by this setup for direct analysis at high levels of sensitivity.

In efficiently cooling the discharge tube 80 and other related parts, the coolant gas introduction system 40 also contributes to the stable maintenance of the generated plasma and prolongs the heat resistant life of the apparatus. Because the introduced coolant gas is released radially out of the outer conductor 50 (i.e., crosswise) via the discharge ports 70, the plasma produced in the discharge tube 80 remains undisturbed by the flow of the coolant gas being released. In a stably maintained state, the plasma diffuses axially upward and is released to the outside through the top opening of the discharge tube 80. These features make it possible to conduct emission spectrometry and mass spectrometry with stability and at high levels of sensitivity.

The microwave leak adjusting system 30 is provided to make sure that the axial length "f" of the conductor surrounding the discharge tube below the bottom wall of the plane waveguide (including the coolant gas introduction system 40) is at least one quarter of the wavelength of the microwave power being used. Thus the system 30 reduces microwave power leaks to the outside, thereby allowing the microwave plasma source apparatus to have less power loss and no radio wave jamming hazards.

In the above embodiment, the upper end of the inner conductor 20 may alternatively be wound with helical conductive coils, the inner diameter of coils being equal to that of the inner diameter 20, the number of turns being 0.5 to 5. Then the coil-equipped upper end may be connected to the end plate 60.

Figure 2A:
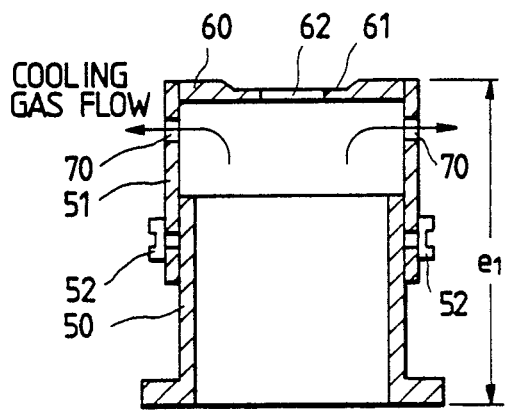
FIGS. 2A and 2B are cross-sectional views of one representative outer conductor of a cylindrical coaxial waveguide used in the embodiment of FIG. 1B.

FIG. 2A shows another illustrative outer conductor arrangement for use with the embodiment of FIGS. 1A and 1B. An axial length "e1" of the outer conductor arrangement is designed to be fine-tuned. A cylinder-shaped first outer conductor 50 is capped with a cap-like second outer conductor 51 made up of conductive material such as copper. The second outer conductor 51 slides axially on the circumference of the first outer conductor 50. To fine-tune the axial length "e1" for the entire outer conductor arrangement, the second outer conductor 51 is made to slide until a predetermined axial length is reached. Then the second outer conductor 51 is fixed where it is using setscrews 52. The end plate 60, the through hole 62 of the discharge tube and the coolant gas discharge ports 70 of this outer conductor arrangement provide the same functions as their counterparts in FIG. 1B. What differs from the preceding embodiment is that these parts are installed on the side of the second outer conductor 51.

Figure 2B:
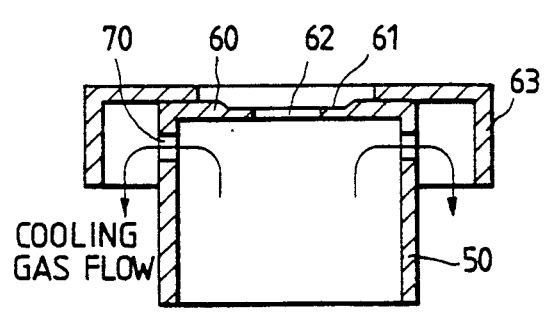

FIG. 2B shows yet another illustrative outer conductor arrangement. With this arrangement, the coolant gas released through the coolant gas discharge ports 70 is deflected by a deflation plate 63 so that the gas does not destabilize the plasma by reaching the tip of the discharge tube 80. More specifically, the flow of the coolant gas released sideways from the discharge ports 70 is deflected downward by the deflection plate 63. This setup virtually eliminates the possibility of the released coolant gas destabilizing the plasma discharged from the tip of the discharge tube 80. This makes it possible to increase the amount of the introduced coolant gas for greater cooling capacity.

Figure 3:
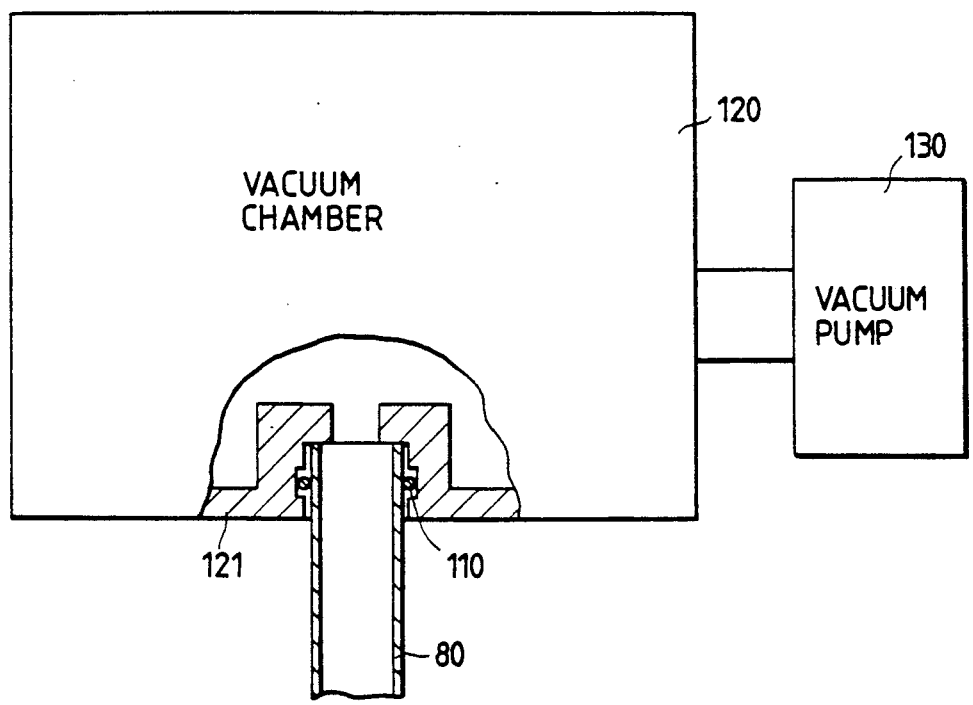
FIG. 3 is a partial cross-sectional view outlining key parts of a microwave plasma source apparatus as another embodiment of the invention.
Figure 6A:
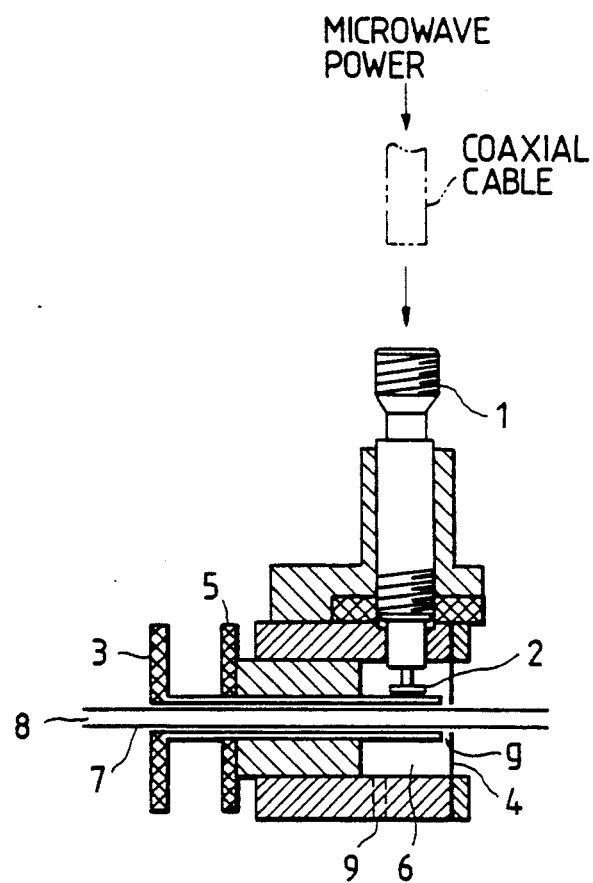
FIGS. 6A and 6B are a cross-sectional view and a side view, respectively, of the typical prior art microwave plasma source apparatus.
Figure 6B:
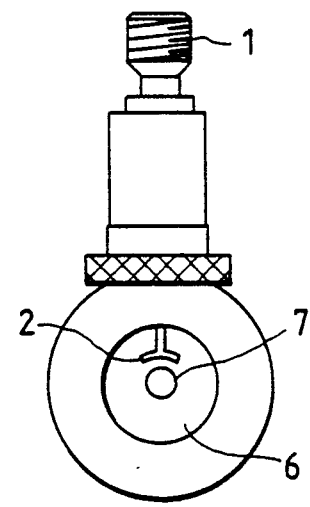

FIG. 3 is a partial cross-sectional view of a microwave plasma source apparatus as another embodiment of the invention. This embodiment suitably functions as a plasma source apparatus that provides plasma jet propulsive energy for space flight as well as plasma processing (for thin film formation and etching of semiconductor devices). In this embodiment, the inner pressure of the discharge tube 80 is decreased for plasma production. As shown in FIG. 3, the tip of the discharge tube 80 is illustratively attached to a vacuum wall 121 of a vacuum chamber 120. The inner space of the vacuum chamber 120 is evacuated by a vacuum pump 130 for pressure reduction. Furthermore, a magnetic field generating means, not shown, may be provided outside the discharge tube 80, the means applying a magnetic field whose intensity meets the electron cyclotron resonance condition within the tube 80. It will be appreciated that the vacuum chamber 120 and the vacuum pump 130 are not needed if this embodiment is used as a plasma jet generator that provides plasma jet propulsive energy for space flight.

FIGS. 4A, 4B and 4C depict other representative discharge tubes used in the embodiment. Shown in FIG. 4A is a discharge tube fit for plasma processing. This discharge tube is a cylinder 2 mm to 30 mm in inner diameter, cut to an appropriate length, and made up of quartz or ceramics. FIG. 4B shows a discharge tube fit for plasma jet production. A nozzle 83 is provided at the tip of the discharge tube, the inner diameter of the nozzle being widened toward the end. FIG. 4C illustrates a discharge tube suitable for trace element analysis. Along the central axis of the lower end of the discharge tube (outer tube) 80 is another discharge tube (inner tube) 81 made up of quartz or ceramics. The assembly constitutes a dual discharge tube structure. The inner tube 81 and outer tube 80 are fixedly supported by fittings 84. To prevent the plasma gas and the sample from leaking out through gaps between fittings 84 and discharge tubes 80 and 81, sealing members 111 such as O-rings are provided as depicted.

FIG. 5 shows a typical tip portion of the discharge tube 80 for use with the embodiment. Where the embodiment of the invention is used to provide plasma jet propulsive energy, it becomes necessary to cool the tip of the discharge tube 80. This need is met by the cooling structure of the discharge tube tip of FIG. 5. As depicted, a freezer 90 constituted by an insulating material or metal surrounds the periphery of the tip (nozzle) 83 of the discharge tube 80, a coolant (e.g., water) flowing through the interior of the freezer 90. A thermally conductive material 100 is interposingly provided between discharge tube 80 and freezer 90 so that heat propagates efficiently from the tube to the freezer.

Where the plane waveguide mentioned earlier is used in applications involving the introduction of microwaves of large power, the bottom wall 13, upper wall 15 and other outer wall portions at high temperatures need to be cooled efficiently. This is achieved by having these walls equipped with radiating fins or with the water cooling system of FIG. 5 to minimize their temperature rise.

As indicated and according to the invention, the cylindrical coaxial waveguide having the mode transforming capability is connected one quarter of the wavelength in use away from the end plate of the plane waveguide. This setup allows microwaves of large power to be efficiently absorbed into the produced plasma without reflected microwave power, thereby producing a stable body of plasma at high levels of temperature and concentration. That in turn yields such benefits as the implementation of more sensitive analytical apparatus, increased plasma jet propulsive energy, and enhanced throughput in plasma processing.

Also according to the invention, the coolant gas introduction system under the discharge tube efficiently cools the surface of the discharge tube as well as the inner wall surface of the coaxial waveguide. The arrangement allows the plasma produced inside the discharge tube to diffuse axially in a stable manner from the tip of the tube. This feature makes it possible to realize emission spectrometry and mass spectrometry of higher sensitivity and to provide greater plasma jet propulsive energy.

As indicated, the microwave leakage adjusting system is provided to make sure that the axial length including the coolant gas introduction system is at least one quarter of the wavelength of the microwave power in use. This setup causes the lower end of the coolant gas introduction system to coincide with a joint of the standing wave of the microwave power. One benefit from this is a significant reduction of microwave leakage out of the apparatus. The lowered leaks translate into a plasma source apparatus with a better S/N ratio and no jamming hazards.

In addition to the plasma-utilizing instruments and apparatus mentioned above, the plasma source apparatus according to the invention is suitable for a vast array of uses such as a vacuum ultraviolet ray source, a metastable atomic beam source, and a high- or low-voltage plasma source for various plasma-related applications.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A microwave plasma source apparatus comprising:
   a plane waveguide having an open end through which to introduce microwave power and an end plate located opposite to said open end;
   a cylindrical coaxial waveguide having the central axis thereof located one quarter of the wavelength of said microwave power away from said end plate of said plane waveguide, an inner and an outer conductor of said cylindrical coaxial waveguide being coupled respectively with a bottom and an upper wall of said plane waveguide; and
   a discharge tube located on the central axis of said inner conductor of said cylindrical coaxial waveguide.

2. A microwave plasma source apparatus comprising:
   a plane waveguide having an open end through which to introduce microwave power and an end plate located opposite to said open end;
   a cylindrical coaxial waveguide having the central axis thereof located in the direction of a microwave electric field formed within said plane waveguide, said axis being coupled with said plane waveguide one quarter of the wavelength of said microwave power away from said end plate toward said open end of said plane waveguide, the lower end of an inner conductor of said cylindrical coaxial waveguide being coupled with a circular hole on a lower wall of said plane waveguide, the upper end of said inner conductor being left open, the lower end of an outer conductor of said cylindrical coaxial waveguide being coupled with a circular hole on an upper wall of said plane waveguide, the upper end of said outer conductor being short-circuited by an end plate having a through hole at the center thereof;

a discharge tube constituted by an electrical insulating material and located along the central axis of said inner conductor, the upper end of said tube being left open and protruding upward from said through hole of said end plate;

a microwave power supplying means for supplying microwave power into said plane waveguide through the open end thereof;

a plasma gas introducing means for introducing plasma gas into said discharge tube through the lower end thereof; and a cooling means for cooling said discharge tube.

3. A microwave plasma source apparatus according to claim 2, wherein said cooling means further comprises:

a chamber provided around the periphery of the lower end of said discharge tube;

a coolant gas introduction pipe for introducing into said chamber a coolant gas in the tangential direction of said chamber; and a plurality of coolant gas discharge ports provided on the outer wall of said outer conductor;

whereby the coolant gas introduced into said chamber is made to flow upward through an interior space of said inner conductor along the outer surface of said discharge tube before said coolant gas is released through said coolant gas discharge ports.

4. A microwave plasma source apparatus according to claim 2, further comprising under the lower edge of said inner conductor a microwave leakage adjusting system surrounding the lower end of said discharge tube, said system being adjusted in terms of axial length to ensure that the distance between the open end of said inner conductor and the bottom surface of a conductive material surrounding the lower end of said discharge tube is at least one quarter of the wavelength of the microwave power in use.

5. A microwave plasma source apparatus according to claim 2, wherein the axial length of said outer conductor is at least one quarter of the wavelength of the microwave power in use.

6. A microwave plasma source apparatus according to claim 2, further comprising a distance adjusting means for adjusting the distance between the upper end of said inner conductor and said end plate having said through hole.

7. A microwave plasma source apparatus according to claim 2, wherein said end plate has, at the periphery of said through hole, a thickness less than the thickness of the outer portion thereof.

8. A microwave plasma source apparatus according to claim 2, further comprising a discharge means for lowering pressure within the interior space of said discharge tube.

9. A microwave plasma source apparatus according to claim 2, wherein the tip of said discharge tube is formed into a nozzle whose inner diameter is widened toward the end thereof.

10. A microwave plasma source apparatus according to claim 2, wherein said discharge tube is of a coaxial dual tube construction comprising an inner and an outer tube, said inner and outer tubes receiving respectively a sample and a plasma gas thereinto.

11. A microwave plasma source apparatus according to claim 2, wherein said cooling means comprises means for cooling the upper end of said discharge tube, said means for cooling the upper end of said discharge tube being attached to the periphery of said upper end of said discharge tube.

12. A microwave plasma source apparatus according to claim 3, further comprising under the lower edge of said inner conductor a microwave leakage adjusting system surrounding the lower end of said discharge tube, said system being adjusted in terms of axial length to ensure that the distance between the open end of said inner conductor and the bottom surface of a conductive material surrounding the lower end of said discharge tube is at least one quarter of the wavelength of the microwave power in use.

13. A microwave plasma source apparatus according to claim 3, wherein the axial length of said outer conductor is at least one quarter of the wavelength of the microwave power in use.

14. A microwave plasma source apparatus according to claim 4, wherein the axial length of said outer conductor is at least one quarter of the wavelength of the microwave power in use.

15. A microwave plasma source apparatus according to claim 3, further comprising a distance adjusting means for adjusting the distance between the upper end of said inner conductor and said end plate having said through hole.

16. A microwave plasma source apparatus according to claim 4, further comprising a distance adjusting means for adjusting the distance between the upper end of said inner conductor and said end plate having said through hole.

17. A microwave plasma source apparatus according to claim 5, further comprising a distance adjusting means for adjusting the distance between the upper end of said inner conductor and said end plate having said through hole.

18. A microwave plasma source apparatus according to claim 3, wherein said end plate has, at the periphery of said through hole, a thickness less than the thickness of the outer portion thereof.

19. A microwave plasma source apparatus according to claim 4, wherein said end plate has, at the periphery of said through hole, a thickness less than the thickness of the outer portion thereof.

20. A microwave plasma source apparatus according to claim 5, wherein said end plate has, at the periphery of said through hole, a thickness less than the thickness of the outer portion thereof.

21. A microwave plasma source apparatus according to claim 6, wherein said end plate has, at the periphery of said through hole, a thickness less than the thickness of the outer portion thereof.

22. A microwave plasma source apparatus according to claim 3, further comprising a discharge means for lowering pressure within the interior space of said discharge tube.

23. A microwave plasma source apparatus according to claim 4, further comprising a discharge means for lowering pressure within the interior space of said discharge tube.

24. A microwave plasma source apparatus according to claim 5, further comprising a discharge means for lowering pressure within the interior space of said discharge tube.

25. A microwave plasma source apparatus according to claim 6, further comprising a discharge means for lowering pressure within the interior space of said discharge tube.

26. A microwave plasma source apparatus according to claim 7, further comprising a discharge means for lowering pressure within the interior space of said discharge tube.

27. A microwave plasma source apparatus according to claim 3, wherein the tip of said discharge tube is formed into a nozzle whose inner diameter is widened toward the end thereof.

28. A microwave plasma source apparatus according to claim 4, wherein the tip of said discharge tube is formed into a nozzle whose inner diameter is widened toward the end thereof.

29. A microwave plasma source apparatus according to claim 5, wherein the tip of said discharge tube is formed into a nozzle whose inner diameter is widened toward the end thereof.

30. A microwave plasma source apparatus according to claim 6, wherein the tip of said discharge tube is formed into a nozzle whose inner diameter is widened toward the end thereof.

31. A microwave plasma source apparatus according to claim 7, wherein the tip of said discharge tube is formed into a nozzle whose inner diameter is widened toward the end thereof.

32. A microwave plasma source apparatus according to claim 8, wherein the tip of said discharge tube is formed into a nozzle whose inner diameter is widened toward the end thereof.

33. A microwave plasma source apparatus according to claim 3, wherein said discharge tube is of a coaxial dual tube construction comprising an inner and an outer tube, said inner and outer tubes receiving respectively a sample and a plasma gas thereinto.

34. A microwave plasma source apparatus according to claim 4, wherein said discharge tube is of a coaxial dual tube construction comprising an inner and an outer tube, said inner and outer tubes receiving respectively a sample and a plasma gas thereinto.

35. A microwave plasma source apparatus according to claim 5, wherein said discharge tube is of a coaxial dual tube construction comprising an inner and an outer tube, said inner and outer tubes receiving respectively a sample and a plasma gas thereinto.

36. A microwave plasma source apparatus according to claim 6, wherein said discharge tube is of a coaxial dual tube construction comprising an inner and an outer tube, said inner and outer tubes receiving respectively a sample and a plasma gas thereinto.

37. A microwave plasma source apparatus according to claim 7, wherein said discharge tube is of a coaxial dual tube construction comprising an inner and an outer tube, said inner and outer tubes receiving respectively a sample and a plasma gas thereinto.

38. A microwave plasma source apparatus according to claim 8, wherein said discharge tube is of a coaxial dual tube construction comprising an inner and an outer tube, said inner and outer tubes receiving respectively a sample and a plasma gas thereinto.

39. A microwave plasma source apparatus according to claim 9, wherein said discharge tube is of a coaxial dual tube construction comprising an inner and an outer tube, said inner and outer tubes receiving respectively a sample and a plasma gas thereinto.

40. A microwave plasma source apparatus according to claim 3, wherein said cooling means comprises means for cooling the upper end of said discharge tube, said means for cooling the upper end of said discharge tube being attached to the periphery of said upper end of said discharge tube.

41. A microwave plasma source apparatus according to claim 4, wherein said cooling means comprises means for cooling the upper end of said discharge tube, said means for cooling the upper end of said discharge tube being attached to the periphery of said upper end of said discharge tube.

42. A microwave plasma source apparatus according to claim 5, wherein said cooling means comprises means for cooling the upper end of said discharge tube, said means for cooling the upper end of said discharge tube being attached to the periphery of said upper end of said discharge tube.

43. A microwave plasma source apparatus according to claim 6, wherein said cooling means comprises means for cooling the upper end of said discharge tube, said means for cooling the upper end of said discharge tube being attached to the periphery of said upper end of said discharge tube.

44. A microwave plasma source apparatus according to claim 7, wherein said cooling means comprises means for cooling the upper end of said discharge tube, said means for cooling the upper end of said discharge tube being attached to the periphery of said upper end of said discharge tube.

45. A microwave plasma source apparatus according to claim 8, wherein said cooling means comprises means for cooling the upper end of said discharge tube, said means for cooling the upper end of said discharge tube being attached to the periphery of said upper end of said discharge tube.

46. A microwave plasma source apparatus according to claim 9, wherein said cooling means comprises means for cooling the upper end of said discharge tube, said means for cooling the upper end of said discharge tube being attached to the periphery of said upper end of said discharge tube.

47. A microwave plasma source apparatus according to claim 10, wherein said cooling means comprises means for cooling the upper end of said discharge tube, said means for cooling the upper end of said discharge tube being attached to the periphery of said upper end of said discharge tube.

48. A microwave plasma source apparatus according to claim 3, further comprising deflector means for deflecting coolant gas discharged through said discharge ports away from said discharge tube.

* * * * *